US012677390B2

(12) United States Patent
Tsorng et al.

(10) Patent No.: US 12,677,390 B2
(45) Date of Patent: Jul. 7, 2026

(54) TOOLLESS LATCH FOR SECURING A COMPONENT MODULE

(71) Applicant: Quanta Computer Inc., Taoyuan City (TW)

(72) Inventors: Yaw-Tzorng Tsorng, Taoyuan City (TW); Tung-Hsien Wu, Taoyuan City (TW); Hsiang-Pu Ni, Taoyuan City (TW); Ren Zhi Zhang, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 82 days.

(21) Appl. No.: 18/812,719

(22) Filed: Aug. 22, 2024

(65) Prior Publication Data

US 2026/0059681 A1     Feb. 26, 2026

(51) Int. Cl.
 *H05K 7/00*     (2006.01)
 *H05K 7/14*     (2006.01)
(52) U.S. Cl.
 CPC .................................. *H05K 7/1409* (2013.01)
(58) Field of Classification Search
 CPC ....... H05K 7/1409; G06F 1/183; G06F 1/186; G06F 1/185; G06F 1/184
 See application file for complete search history.

(56) References Cited

U.S. PATENT DOCUMENTS 4,161,017 A     7/1979   Pierce et al.
4,745,524 A     5/1988   Patton, III

| | | | |
|---|---|---|---|
| 5,424,910 A * | 6/1995 | Lees | H02B 11/12 |
| | | | 361/615 |
| 6,118,668 A * | 9/2000 | Scholder | G06F 1/184 |
| | | | 361/801 |
| 6,288,911 B1 * | 9/2001 | Aoki | H05K 7/1409 |
| | | | 361/801 |
| 7,929,317 B2 * | 4/2011 | Cheng | H05K 7/1429 |
| | | | 361/801 |
| 8,432,670 B2 * | 4/2013 | Chen | G11B 33/124 |
| | | | 361/679.02 |
| 9,122,458 B2 * | 9/2015 | Yu | G06F 1/185 |
| 9,583,877 B1 * | 2/2017 | Angelucci | H05K 7/1409 |
| 9,921,616 B1 * | 3/2018 | Yuan | G06F 1/185 |
| 10,303,226 B2 * | 5/2019 | Chen | G06F 1/186 |

(Continued)

OTHER PUBLICATIONS

TW Office Action for Application No. 113147203 mailed Oct. 15, 2025, w/ Summary, 10 pp.

(Continued)

*Primary Examiner* — Rockshana D Chowdhury
(74) *Attorney, Agent, or Firm* — Nixon Peabody LLP

(57) ABSTRACT

A component module for a computer device with a toolless attachment mechanism is disclosed. The component module includes a support plate and a connector insertable in a slot on a motherboard of the computer device. A rotatable latch is mounted on the support plate. The rotatable latch has a locked position engaging a locking nut on the motherboard to fix the component module to the motherboard. The rotatable latch has a released position disengaging the locking nut to allow the modular component to be released from the motherboard. The rotatable latch engages a pin on a top cover installed over the motherboard to rotate the latch to the locked position.

17 Claims, 9 Drawing Sheets

(56)            References Cited

U.S. PATENT DOCUMENTS

| | | | | |
|---|---|---|---|---|
| 10,939,573 | B1 * | 3/2021 | Liao | H01R 13/62983 |
| 11,369,036 | B2 * | 6/2022 | Chang | G06F 1/20 |
| 11,441,329 | B2 * | 9/2022 | Tseng | E05B 13/10 |
| 11,558,976 | B2 * | 1/2023 | Chang | H05K 7/1487 |
| 11,606,874 | B2 * | 3/2023 | Lewis | G06F 1/185 |
| 12,238,884 | B2 * | 2/2025 | Escamilla | H05K 7/1402 |
| 2005/0152122 | A1 * | 7/2005 | Fan | H05K 7/1409 |
| | | | | 361/752 |
| 2005/0231923 | A1 * | 10/2005 | Peng | G06F 1/184 |
| | | | | 361/754 |
| 2008/0074837 | A1 * | 3/2008 | Denny | H05K 7/1409 |
| | | | | 361/679.33 |
| 2022/0400571 | A1 * | 12/2022 | Yang | H05K 7/20781 |
| 2023/0009926 | A1 | 1/2023 | Tsorng et al. | |

OTHER PUBLICATIONS

TW Search Report for Application No. 113147203 mailed Oct. 15, 2025, w/ First Office Action, 1 p.

* cited by examiner

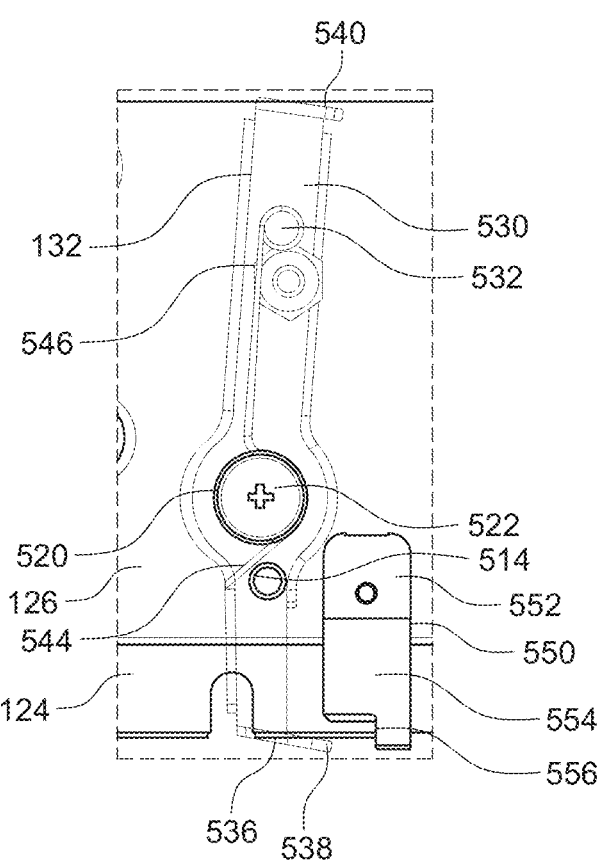
FIG. 5B
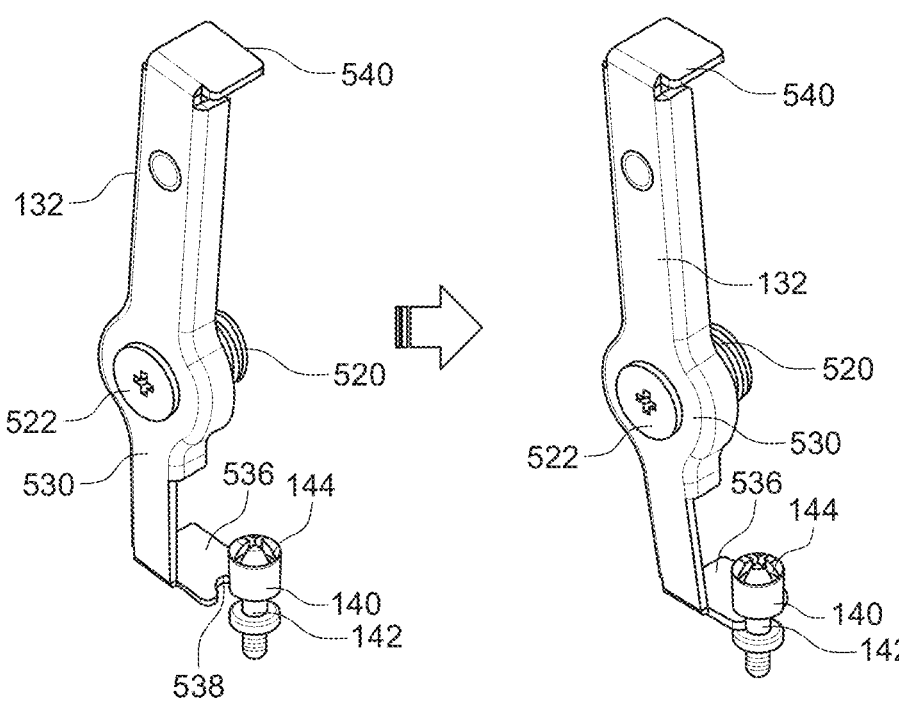
FIG. 5C                    FIG. 5D

TOOLLESS LATCH FOR SECURING A COMPONENT MODULE

TECHNICAL FIELD

This disclosure relates generally to mechanisms for securing component modules to a computing device, and more specifically, to a toolless mechanism to lock a component module component to a socket on a motherboard.

BACKGROUND

Computer servers are computer devices generally designed for certain specialized functions. Servers generally include common components such as processors, memory, a cooling system, and a power system. Generally, servers have a chassis that contains walls of a certain height that may be standardized for insertion of the chassis in racks in a data center. The chassis generally holds a motherboard with the basic components such as the processors, dual in line memories (DIMMs), storage devices, and other circuits. Servers can be specially designed to enhance performance of certain functions. For example, an application server may have relatively more processors for processing applications or a storage server may have more storage devices for more storage capability. Such capabilities may also be enhanced through using modular components such as network interface cards, memory cards, or processor cards that may be attached to the motherboard.

Various protocols allow a user the flexibility of adding or enhancing functions in a computer system, such as through additional hardware expansion component modules. Expansion component modules are essentially smaller circuit boards that may be inserted in the server chassis and include functional components such as storage devices or processors that may be electrically connected to the other server components. One well-known standard for communication between server components is the peripheral component interconnect express (PCIe) standard. Thus, a server will often include PCIe compatible slots that allow the insertion of PCIe compliant expansion cards to expand the functionality of the server.

A motherboard of a server may include slots for several expansion component modules, all of which need to be secured within the chassis using an attachment mechanism. FIG. 1A is an isolated view of a known computer server motherboard 10 that includes an expansion slot 12. A component module 20 including a support plate 22 and a circuit board 24 with a golden finger edge connector 26 may be attached to the motherboard 10. In this example, the component module may include a graphic processing unit (GPU). In this example, the golden finger edge connector 26 is inserted in the slot 12. The component module 20 requires the additional attachment mechanism to stabilize the component module 20 relative to the motherboard 10. The use of a separate mechanism also ensures the stability of the connection to the gold finger connector 26, thereby preventing issues caused by component module displacement. During the process, module fixation methods can be categorized into tool-required and toolless designs. An example tool-required design is shown in FIG. 1A. The component module 20 includes support brackets 28 that hold a screw 30. The screw 30 may be inserted in a hole on the motherboard 10 and thus may be used to secure the component module 20 to the motherboard 10. The screw 30 requires a tool such as a screwdriver for securing the component module 20 to the motherboard 10.

Screws and other fasteners for such attachment mechanisms thus require specialized tools for assembly. To obviate the need for a specialized tool, another attachment mechanism is a toolless latch mechanism for attaching the component module 20 to the motherboard 10 as shown in FIG. 1B. In this example, a moveable latch 42 includes a finger tab 44 and an opposite locking tab 46. The locking tab 46 engages a slot in a support 48 that is attached to the motherboard 12. Pulling the finger tab 44 causes the locking tab 46 to engage the slot in the support 48 and thus secure the component module 20 to the motherboard 10. Toolless designs such as that shown in FIG. 1B allow users to quickly disassemble and assemble component modules and a motherboard without the need to supply tools based on different screw types.

In known server chassis structures, the assembly of a component module to a motherboard requires four basic steps. FIG. 2 shows a sequence of assembling the component module 20 to the motherboard 10 using an attachment mechanism. First, a chassis 50 is opened by removing a top cover 52 to expose the motherboard 10. Second, the component module 20 is inserted into the slot 12 on the motherboard 10. Third, the attachment mechanism such as the screw 30 is manipulated to secure the component module 20 to the motherboard 10. As shown in this step, a tool 54 such as a screwdriver is required to turn the screw 30 to attach the component module 20 to the motherboard 10. Fourth, once the component module 20 is installed, the chassis 50 is closed by replacing the top cover 52 to complete the overall assembly.

However typical toolless attachment mechanism designs must consider space required for the hand of an installer. For example, when space is limited, toolless designs cannot be implemented structurally. FIG. 3A shows a chassis 50 with known toolless attachment mechanisms, where several component modules 20 are inserted in the chassis 50. The inserted component modules 20 restrict the ability for an installer to easily use a toolless mechanism 60 such as a rotating lever handle. In this example, access to a rotating handle of the toolless mechanism 60 is constrained by the placement of the component modules 20.

Additionally, some toolless designs require continuous one-handed operation during assembly and disassembly. For example, the latch 42 in FIG. 1B may be one of several features that require one hand operation to attach the component module 20. FIG. 3B shows an additional mechanism such as a finger notch 64 and a finger hold 66 on a top plate 68 of the component module 20. The finger notch 64 and finger hold 66 require a continuous one-handed grip. Since these features are on the opposite end of the top plate 68 from the lever 40, this spacing prevents operation of the lever 42 by one hand while the component module 20 is gripped.

In current designs, when the component module is large or heavy, users may need both hands for assembly and disassembly of the component module to the motherboard. The requirement for two handed installation makes toolless designs that require hand operation impractical as they cannot be used. FIG. 3C shows a known component module 70 that is installed in the slot 12 of the motherboard 10 of the chassis 50. The component module 70 includes a known toolless lever 72 for securing the component module 70 to the motherboard 10. The component module 70 includes additional finger apertures 74 and 76 formed in a top support plate 78 as well as a finger notch 80 on the opposite side of the plate 78. The apertures 74 and 76 and finger notch 80 are provided due to the size of the component module and allow an installer to use both hands to grip the component module 70. Thus, no hand is available to operate the lever 72 when the component module 70 is being installed.

There is therefore a need for a toolless attachment mechanism that allows operators to secure component modules in confined spaces without direct manual operation, thereby eliminating the need for a separate module fixation step. There is also a need for a toolless mechanism for attaching electronic components securely that eliminates steps used in current configurations. There is also a need for a latch mechanism that may be engaged without the need for any specialized tools.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an example component module for a computer device is disclosed. The component module includes a support plate and a connector insertable in a slot on a motherboard of the computer device. A rotatable latch is mounted on the support plate. The rotatable latch has a locked position engaging a locking nut on the motherboard of the computer device to secure the component module to the motherboard. The rotatable latch has a released position disengaging the locking nut to allow the modular component to be released from the motherboard. The rotatable latch engages a pin on a top cover installed over the motherboard to rotate the latch to the locked position.

A further implementation of the example component module includes a spring providing spring force to bias the rotatable latch to the released position. Another implementation is where the example component module includes one of a graphic processing unit (GPU), a central processing unit (CPU), a solid state storage device (SSD), or a network interface card (NIC). Another implementation is where the example component module includes a circuit board parallel to the support plate. The connector is a golden finger connector on the edge of the circuit board. Another implementation is where the rotatable latch is rotated around a setting screw attached to the support plate. Another implementation is where the rotatable latch includes an engagement flange having a semi-circular cutout to engage the locking nut. Another implementation is where the example component module includes a protective cylinder attached to the support plate. The protective cylinder is positioned over the locking nut when the component module is secured to the motherboard. Another implementation is where the example component module includes a top plate attached in perpendicular orientation to the support plate.

Another disclosed example is a computer device that includes a chassis having two side walls. A motherboard is mounted in the chassis between the side walls. The motherboard includes a connector slot and a locking nut. A top cover is insertable over the chassis between the two side walls. The top cover includes a pin extending therefrom. A component module has a support plate and a connector insertable in the connector slot of the motherboard. A rotatable latch is mounted on the support plate. The rotatable latch has a locked position engaging the locking nut to fix the component module to the motherboard. The rotatable latch has a released position disengaging the locking nut to allow the modular component to be released from the motherboard. The rotatable latch engages the pin of the top cover to rotate the latch to the locked position.

A further implementation of the example computer device includes a spring providing spring force to bias the rotatable latch to the released position. Another implementation is where the component module includes one of a graphic processing unit (GPU), a central processing unit (CPU), a solid state storage device (SSD), or a network interface card (NIC). Another implementation is where the component module includes a circuit board parallel to the support plate, and where the connector is a golden finger connector on the edge of the circuit board. Another implementation is where the rotatable latch is rotated around a setting screw attached to the support plate. Another implementation is where the rotatable latch includes an engagement flange including semi-circular cutout to engage the locking nut. Another implementation is where the component module includes a protective cylinder attached to the support plate. The protective cylinder is positioned over the nut when the modular component is secured to the motherboard. Another implementation is where the mother board includes another connector slot and another locking nut. The component module is insertable into the another connector slot. Another implementation is where the top cover includes another pin in alignment with another connector slot to engage the rotatable lever when the component module is inserted in the another connector slot.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 5B is a close up side view of the automatic toolless attachment mechanism in FIG. 4A;

FIG. 5C is a perspective view of the rotatable latch in FIG. 5A in a released position;

FIG. 5D is a perspective view of the rotatable latch in FIG. 5A in a locked position;

DETAILED DESCRIPTION

Figure 1A:
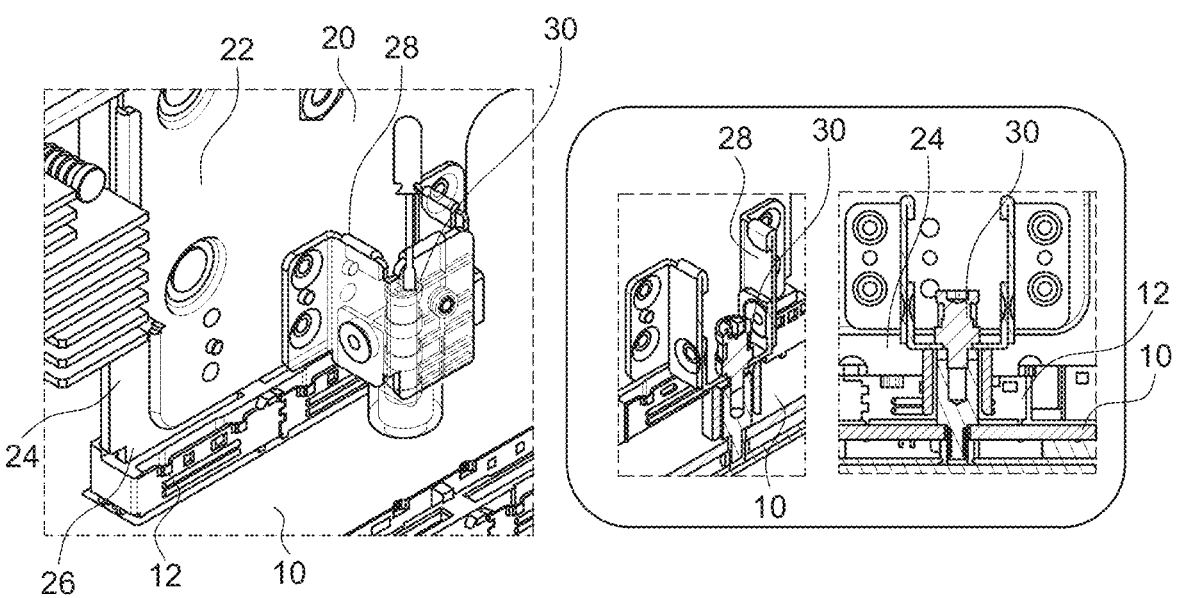
FIG. 1A is an example prior art tool required attachment mechanism for securing a component module to a motherboard of a computing device.
Figure 1B:
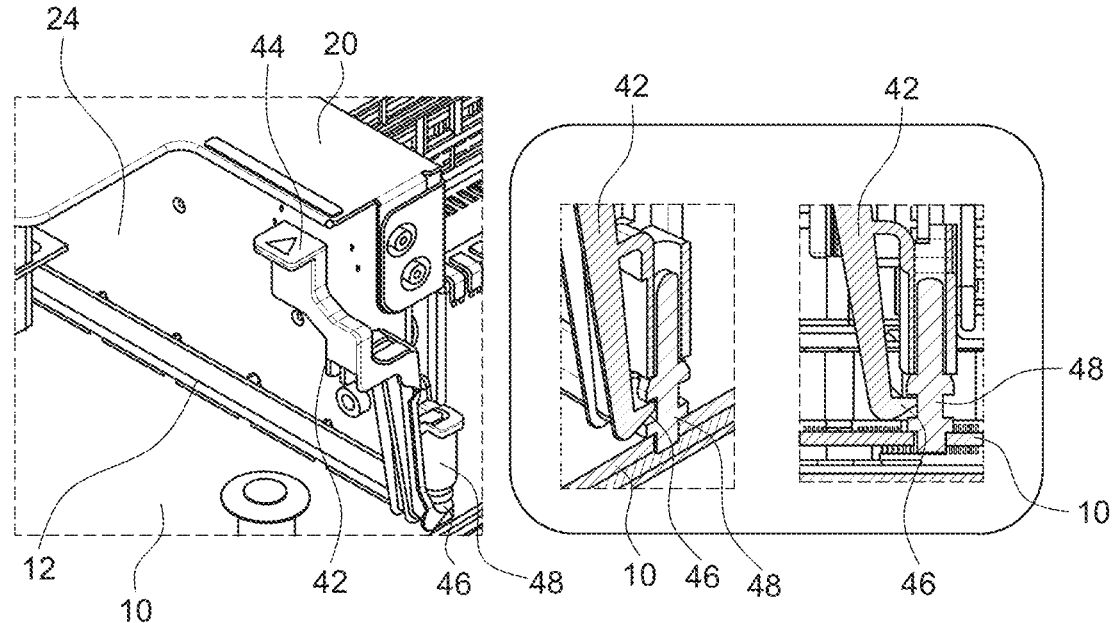
FIG. 1B is an example prior art toolless attachment mechanism for securing a component module to a motherboard of a computing device.
Figure 2:
FIG. 2 is a sequence showing assembly of the component module to the motherboard using the prior art tool required mechanism.
Figure 3A:
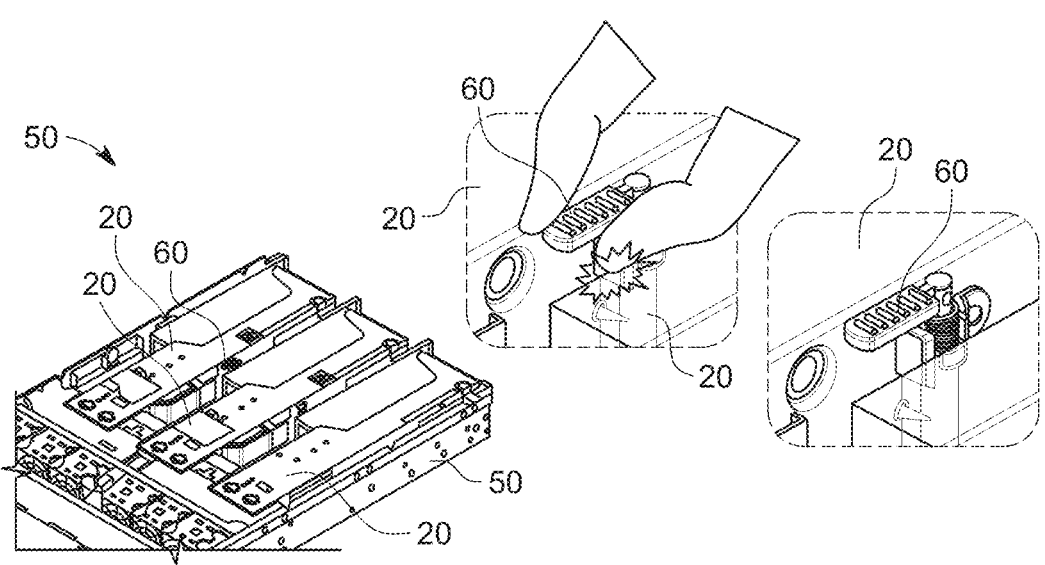
FIG. 3A is a perspective view of a space limitation problem for operating a prior art toolless mechanism.
Figure 3B:
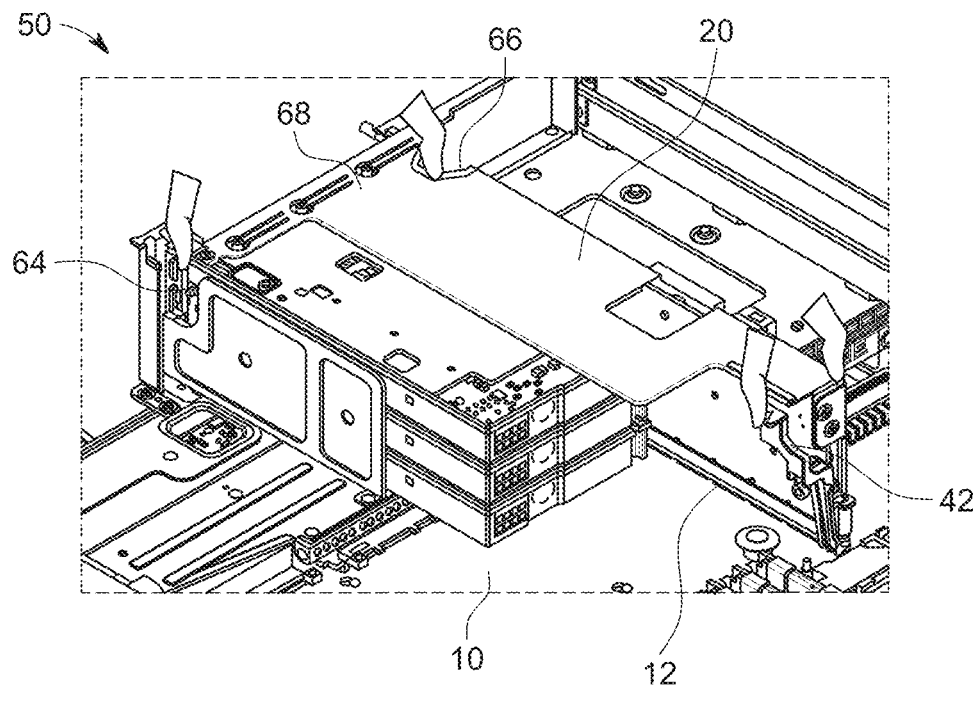
FIG. 3B is a perspective view of a problem of requiring one handed operation for securing a prior art component module.
Figure 3C:
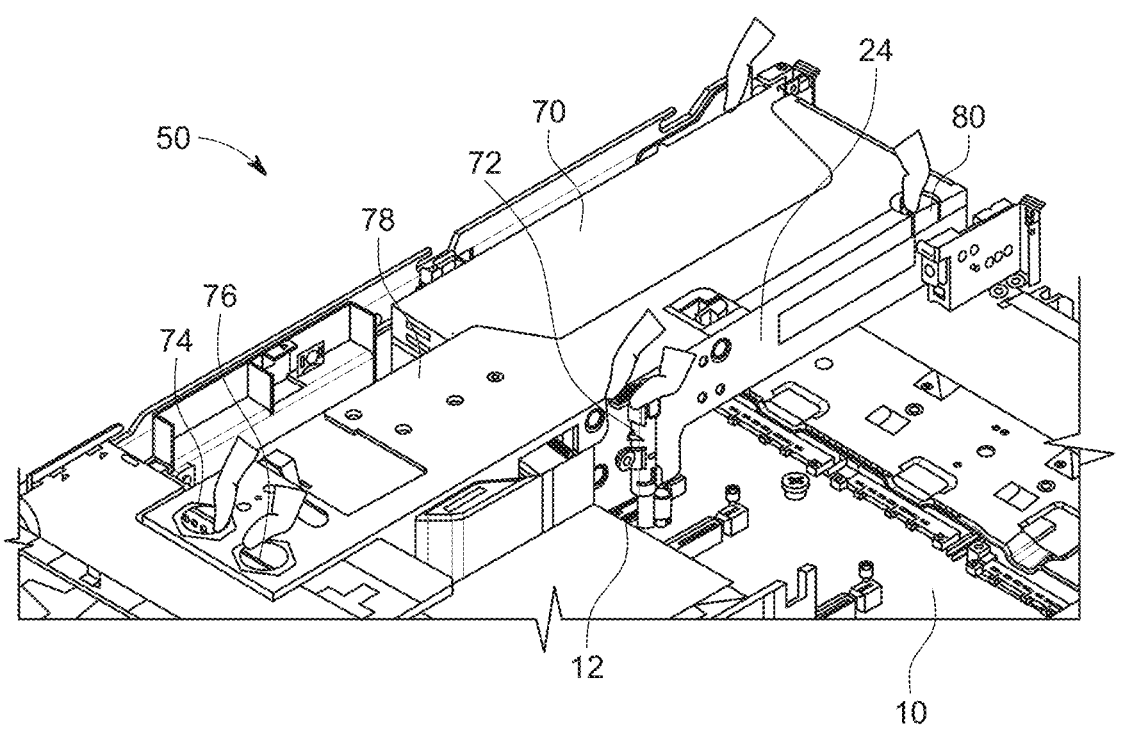
FIG. 3C is a perspective view of a problem of two hand operation for securing a current component module attachment to the motherboard.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a toolless attachment mechanism to secure a component module to a motherboard in a computer device chassis. The chassis has a top cover that may be slid over the chassis to enclose the motherboard. The component module includes a golden finger connector that may be inserted in a slot in the motherboard. A rotatable locking latch is attached to the component module. The locking latch is spring biased to a released position. The locking latch may be rotated to and held in a locked position where it engages a registration feature on the motherboard such as a fixed nut. The top cover has a pin extending from an interior surface. When the top cover slides into place over the chassis, the pin contacts the locking latch and rotates the locking latch into the locked position. The locking latch thus engages the fixed nut to secure the component module. When the top cover is pulled out to uncover the chassis, the pin moves with the cover, and the locking latch is rotated by spring force to the released position, thereby allowing the module component to be removed. The example attachment mechanism thus eliminates an assembly step while allowing for toolless securing of a component module to a motherboard in a constrained space.

Figure 4:
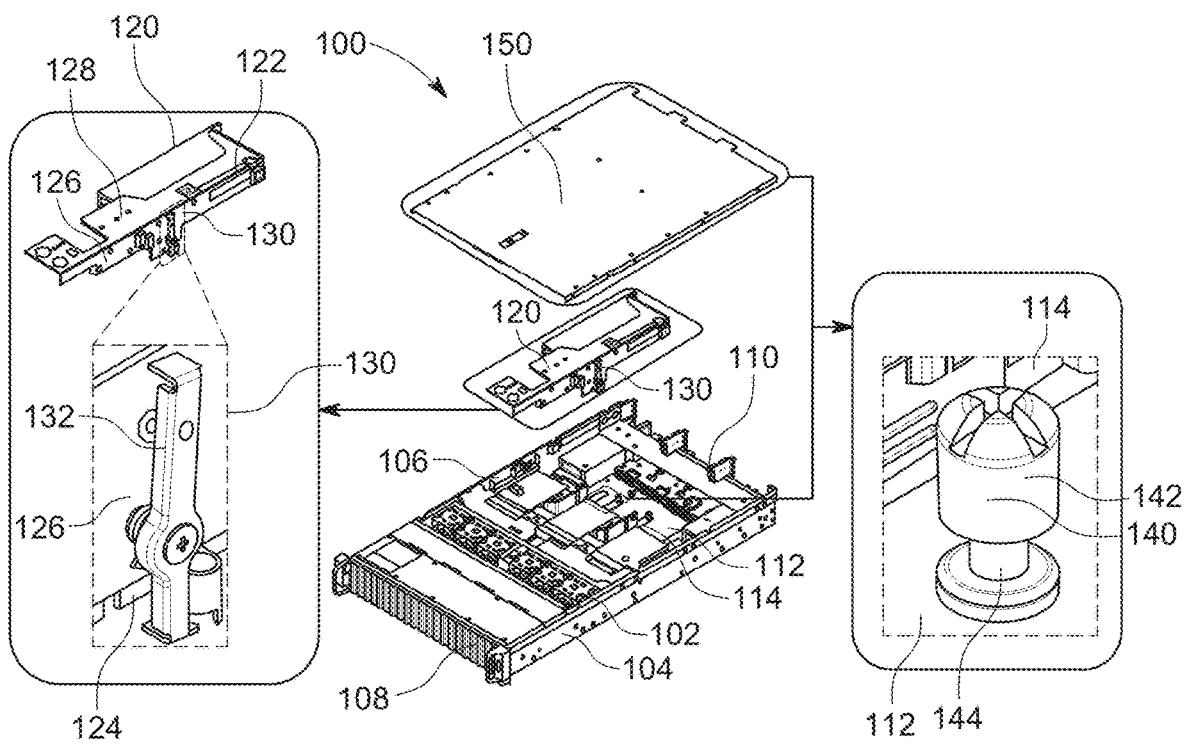
FIG. 4 is a perspective exploded view of the example automatic toolless attachment mechanism for securing component modules.

FIG. 4 is an exploded perspective view of the components of the example toolless attachment mechanism for securing a component module to a computing device 100 such as a server. In this example, a chassis 102 for the computing device 100 has side walls 104 and 106 and a front end 108 and a rear end 110. Any other computer device with a similar chassis such as a storage device, storage server, router, switch and the like may incorporate the principles described herein to secure modular components. The chassis 102 holds a motherboard 112 that is fixed to the bottom of the chassis 102. The chassis 102 may include components such as power supplies, a fan wall, connectors, and the like for operating the computing device 100. The motherboard 112 in this example may include processors, memory modules, memory chips, and other electronic components. The motherboard 112 in this example includes two slots 114 that each may be used to connect component modules such as a component module 120. In this example, the slots 114 each accommodate golden finger connectors to allow power and data signals to be communicated between a component module and components on the motherboard 112.

The component module 120 in this example is a graphic processing unit (GPU) type component, but other components such as solid state storage devices (SSD) s, CPUs, NPUs, network interface cards (NIC) s, or the like may be carried in the component module 120. The component module 120 includes a circuit board 122 that holds the GPU and other electronic components. An open edge of the circuit board 122 is a golden finger connector 124 that may be inserted in any of the slots 114 of the motherboard 112. The component module 120 includes a side support plate 126 that supports the circuit board 122. The side support plate 126 is attached perpendicularly to a top support plate 128 that is attached to an opposite edge of the circuit board 122.

The component module 120 includes a toolless latch assembly 130 that is attached to the support plate 126. The latch assembly 130 is attached to the side support plate 126 to engage the motherboard 112 when the component module 120 is inserted in one of the slots 114. A latch 132 may be rotated to fix the component module 120 to the motherboard 112. In this example, the motherboard 112 may accommodate up to two component modules via the two slots 114. It is to be understood that the example toolless attachment mechanism may be used for any like component modules and other motherboards that may have greater or fewer than three slots for component modules.

A fixed locking nut 140 is attached to the motherboard 112 in proximity to each of the slots 114. As will be explained, the latch 132 of the latch assembly 130 has a locked position, where the latch 132 engages the fixed locking nut 140 to secure the component module 120 to the motherboard 112 once the golden finger connector 124 is inserted in the slot 114. The fixed locking nut 140 has a main body 142 with a set of slots for engaging a tool such as a screw driver. The main body 142 is joined to a stem 144 that includes a threaded portion that may be screwed into a hole in the motherboard 112. A top cover 150 includes registration features on side edges that mate with slots in the sides of the chassis 102. This allows the top cover 150 to slide over the chassis 102 and thus enclose the motherboard 112.

Figure 5A:
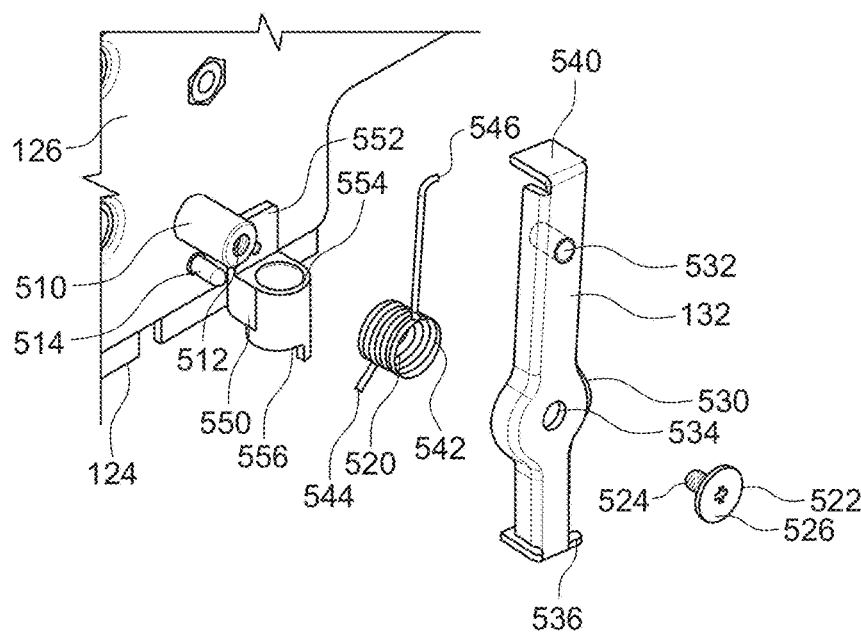
FIG. 5A is an exploded view of the components of the automatic toolless attachment mechanism in FIG. 4A.

FIG. 5A shows an exploded perspective view of the components of the latch assembly 130. One side of the support plate 126 of the component module 120 includes a cylindrical nut 510 with a screw hole 512. A spring pin 514 extends from the support plate 126 under the cylindrical nut 510. The toolless latch assembly 130 includes the rotatable latch 132, a coil spring 520, and a stepped screw 522. The stepped screw 522 has a threaded shaft 524 extending from a circular head 526 with a cross shaped slot 528 to allow the stepped screw 522 to be tightened via a tool. The latch 132 includes a main support 530 that has a spring pin 532 and a mounting hole 534. The bottom end of the main support 530 is attached to a bottom engagement flange 536. The engagement flange 536 includes a semi-circular cutout 538 (shown in FIG. 5C) that may engage the fixed locking nut 140. The opposite top end of the main support 530 has a contact flange 540.

The coil spring 520 has a coil 542 and two arms 544 and 546 that compress the coil 542 when rotated relative to each other. The threaded shaft 524 of the stepped screw 522 is inserted through the mounting hole 534 and the coil 542 of the coil spring 520. The threaded shaft 524 is inserted into the screw hole 512 of the cylindrical nut 510 to allows the main support 530 to rotate around the mounting hole 534.

FIG. 5B shows a side view of the latch assembly 130 attached to the support plate 126 of the component module 120. The latch 132 may be rotated around the threaded shaft 524 of the stepped screw 522. The spring pins 514 and 532 restrain the respective arms 544 and 546 of the coil spring 520 and are used to compress the coil spring 520. The latch 132 is thus installed on the support plate 126 by tightening the stepped screw 522 in the cylindrical nut 510 shown in FIG. 5A. A guide assembly 550 is attached to the support plate 126. The guide assembly 550 includes a plate 552 that may be attached to the support plate 126. The guide assembly 550 includes a protective cylinder 554 that may be inserted over the fixed locking nut 140 shown in FIG. 4. The protective cylinder 554 has a cutout 556 that allows the engagement flange 536 to access the fixed locking nut 140 when the rotatable lever 132 is in the locked position.

FIG. 5C is a close up perspective view of the latch 132 of the latch assembly 130 and the fixed locking nut 140 when the latch 132 is in a released position. In this position, the latch 132 is rotated clockwise around the stepped screw 522.

The rotation of the latch 132 thus rotates the engagement flange 536 away from the fixed locking nut 140 and disengages the semi-circular cutout 538. The component module 120 thus may be removed from the motherboard 112. The spring force from the coil spring 520 biases the latch 132 to the released position in FIG. 5C.

FIG. 5D is a close up perspective view of the latch 132 in a locked position engaging the fixed locking nut 140 on the motherboard 112. In this position, the latch 132 is rotated counterclockwise around the stepped screw 522. The rotation of the latch 132 in the locked position thus rotates the engagement flange 536 toward the fixed locking nut 140. The semi-circular cutout 538 thus engages the stem 144 of the fixed locking nut 140 to secure the component module 120.

Figure 6A:
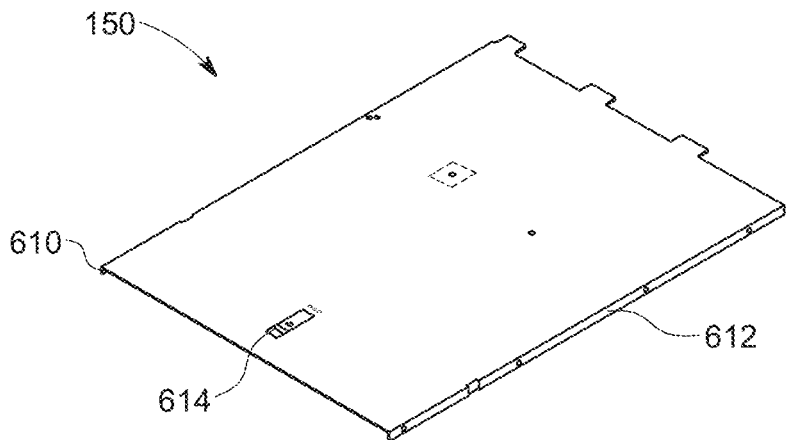
FIG. 6A is a top view of the top cover of the chassis in FIG. 4.
Figure 6B:
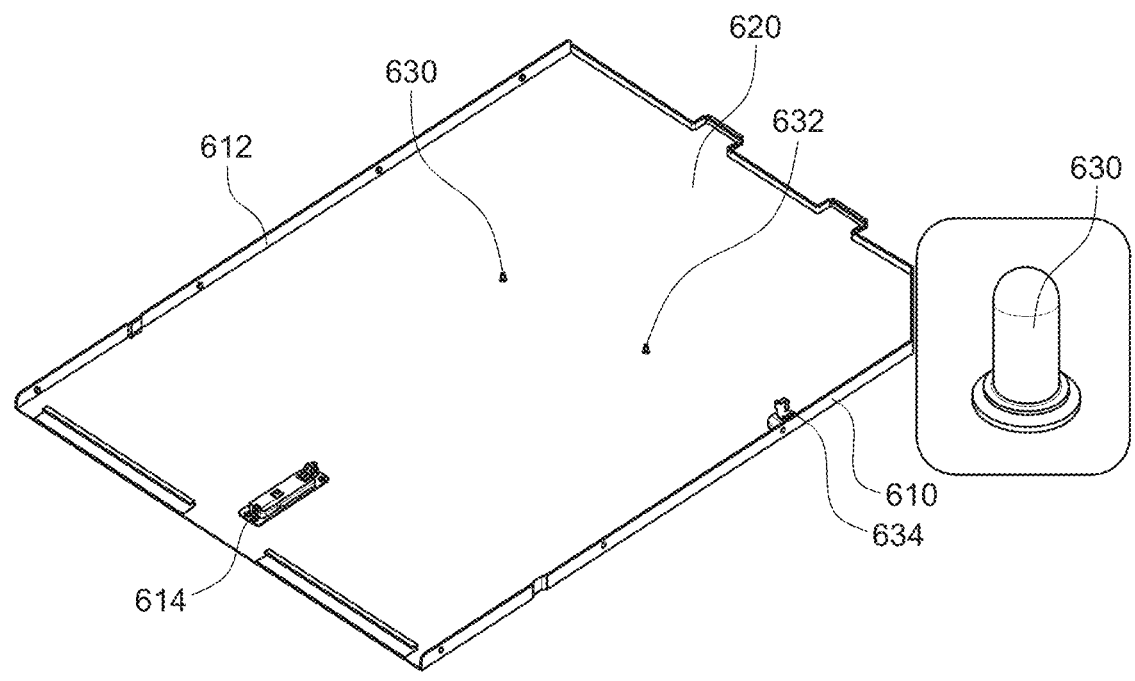
FIG. 6B is a reverse top view of the top cover of the chassis in FIG. 4.

FIG. 6A shows a top side perspective view of the top cover 150. FIG. 6B shows a bottom side perspective view of the top cover 150. The top cover 150 includes a pair of side flanges 610 and 612 that may be inserted in slots at the top of the side walls 104 and 106 of the chassis 102 in FIG. 4. A locking latch mechanism 614 includes a spring biased slide that allows the top cover 150 to be locked in the closed position covering the entire chassis 102. Moving the slide releases the locking latch mechanism 614 and allows the top cover 150 to be slidably removed from the chassis 102 from the rear end 110.

An interior surface 620 of the top cover 150 includes pins 630, 632, and 634 that each extend downward from the interior surface 620. The pins 630 and 632 are positioned in alignment with the corresponding latch assembly 130 of a component module such as the component module 120 when the component module 120 is inserted in one of the two slots 114 in the motherboard 112. In this manner, the pins 630 and 632 cause the latch 132 to be rotated when the top cover 150 is moved relative to the chassis 102 in FIG. 4.

Figure 7A:
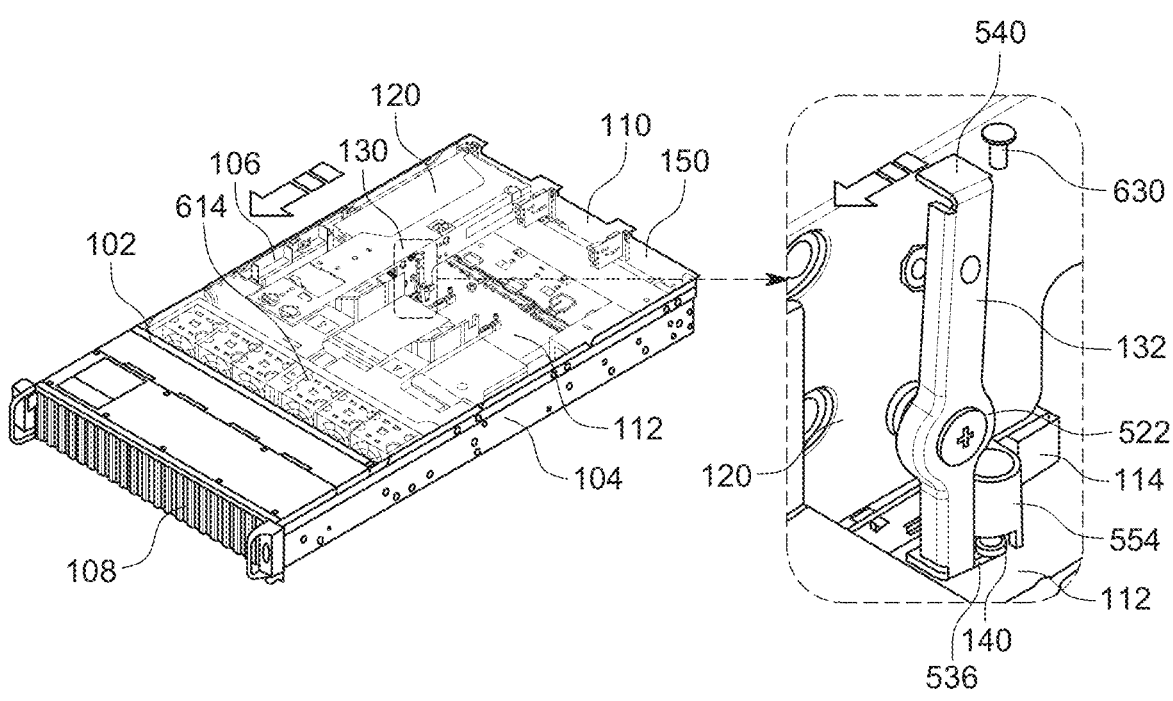
FIGS. 7A-7B are a sequence of automatic attachment of a component module via the top cover and the example attachment mechanism.
Figure 7B:
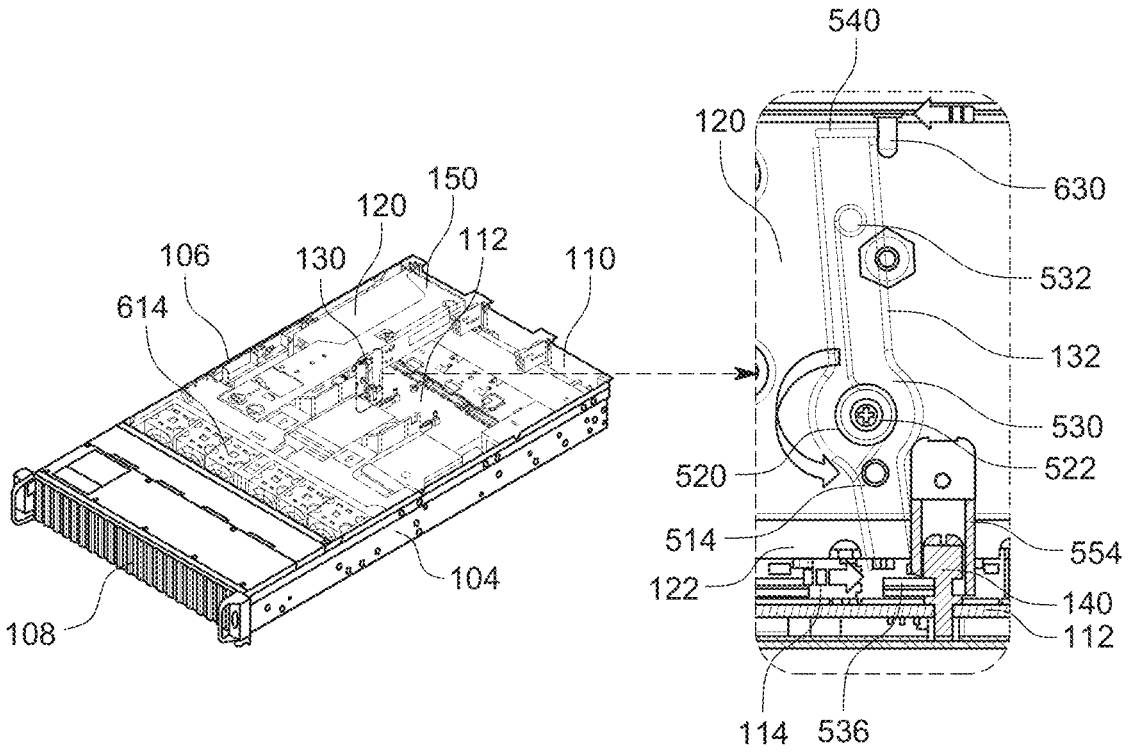

FIG. 7A-7B shows a cutaway perspective view of the chassis 102 showing the process of securing the component module 120 to the motherboard 112 using the example latch assembly 130. Like elements in FIGS. 4-6B are labeled with like reference numerals in FIGS. 7A-7B. The locking process involving the latch assembly 130 is a toolless process that is automatically performed by sliding the top cover 150 in place over the chassis 102 after the component module 120 is inserted in one of the slots 114. Thus, a separate step of activating a toolless mechanism prior to replacing the top cover 150 is avoided by the example latch assembly 130.

Initially the top cover 150 in FIG. 4 may be removed from the chassis 102 by releasing the latch 614 and pulling the top cover 150 away from the front end 108 by sliding the flanges 610 and 612 into FIG. 6A in the slots of the side walls 104 and 106 of the chassis 102. When the top cover 150 is removed, the slots 114 may be accessed from the top of the chassis 102. Thus, the golden finger connector 124 of the circuit board 122 of the component module 120 may be inserted in any of the slots 114 of the motherboard 112. The protective cylinder 554 is inserted over the locking nut 140 on the motherboard 112. Once the component module 120 is in place, the top cover 150 may be inserted back over the chassis 102 by inserting the flanges 610 and 612 in the slots of the side walls 104 and 106 of the chassis 102 from the rear end 110.

FIG. 7A shows the top cover 150 partially inserted over the chassis 102 where the flanges 610 and 612 are guided by the slots of the side walls 104 and 106. The top cover 150 is pushed toward the front end 108 of the chassis 102. While the top cover 150 is not full inserted, the latch 132 is forced to the release position via the coil spring 520 and thus the component module 120 is not secured to the motherboard 112. As the top cover 150 is pushed to the front end 108 to entirely cover the chassis 102 as shown in FIG. 7B, the pin 630 contacts the contact flange 540 of the latch 132 and forces the latch 132 to rotate counter-clockwise against the spring force provided by the coil spring 520. The latch 132 thus rotates and the engagement flange 536 engages the fixed locking nut 140 to secure the component module 120 to the motherboard 112.

Figure 8A:
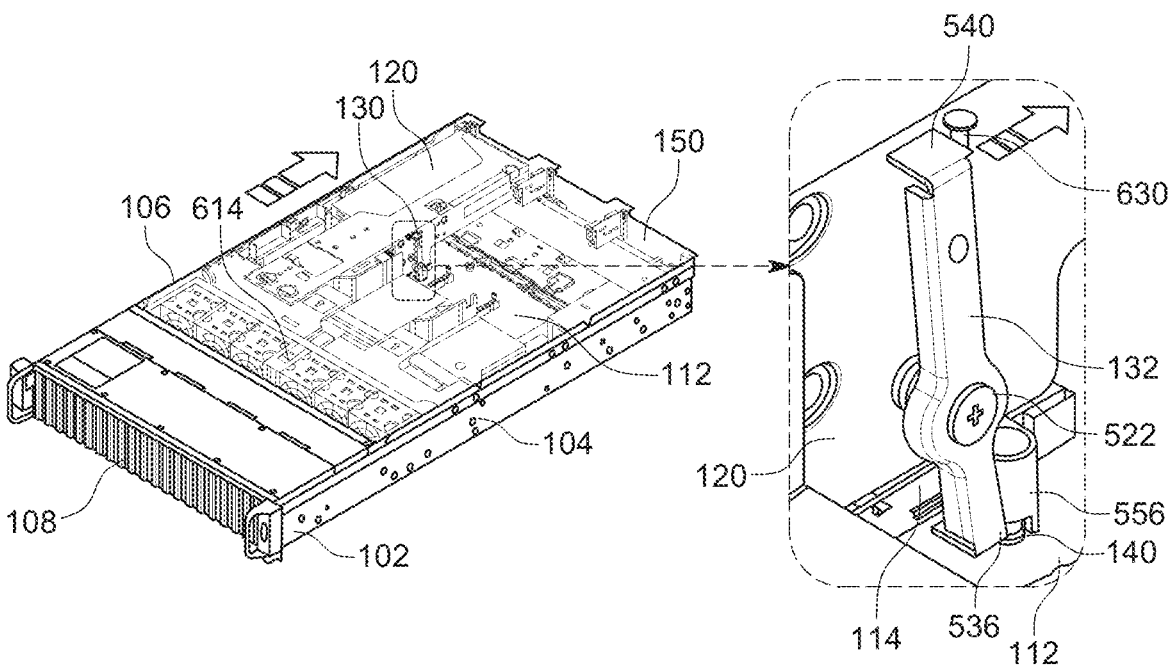
FIGS. 8A-8B are a sequence of the automatic unlocking of a component module via the top cover and the example attachment mechanism.
Figure 8B:
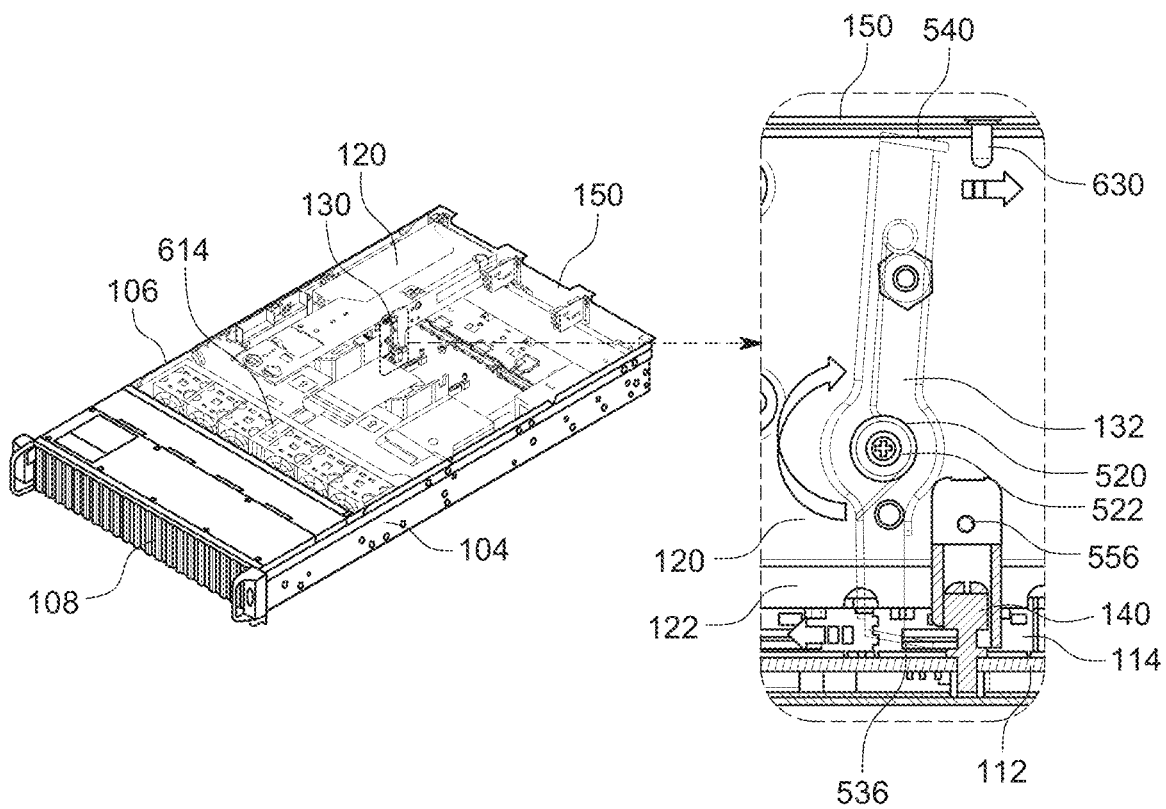

FIGS. 8A-8B show a cutaway perspective view of the chassis 102 showing the release process that may be automatically initiated by the toolless latch assembly 130. Like elements in FIGS. 4-6B are labeled with like reference numerals in FIGS. 7A-7B. FIG. 8A shows the top cover 150 fully enclosing the chassis 102. The flanges 610 and 612 of the top cover 150 engage the side walls 104 and 106. As shown in the inset, the pin 630 contacts the contact flange 540 and thus keeps the latch 132 in the locked position against the spring force of the coil spring 520. In the locked position, the component module 120 is secured as the engagement flange 536 is locked to the fixed locking nut 140 attached to the motherboard 112.

When the top cover 150 is opened by releasing the slide of the locking latch mechanism 614, the top cover 150 may be pulled away from the front end 108 of the chassis 102. The movement of the top cover 150 moves the pin 630 away from the contact flange 540 as shown in the inset. The absence of the pin 630 allows spring force from the coil spring 520 to rotate the latch 132 clockwise around the stepped screw 522, thus disengaging the engagement flange 536 from the locking nut 140. This allows the component module 120 to pulled away from the motherboard 112 by pulling the golden finger connector out of the slot 114.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A component module for a computer device having a chassis, the component module comprising:
a support plate;
a connector insertable in a slot on a motherboard in the chassis of the computer device; and
a rotatable latch mounted on the support plate, the rotatable latch having a locked position and a released position, the locked position engaging a locking nut on the motherboard of the computer device to secure the component module to the motherboard, and released position disengaging the locking nut to allow the modular component to be released from the motherboard, the rotatable latch aligned with a pin extending downward from an interior surface of a top cover, wherein the pin engages the rotatable latch to rotate the latch to the locked position when the top cover is moved to a position over the motherboard.

2. The component module of claim 1, further comprising a spring providing spring force to bias the rotatable latch to the released position.

3. The component module of claim 1, further comprising one of a graphic processing unit (GPU), a central processing unit (CPU), a solid state storage device (SSD), or a network interface card (NIC).

4. The component module of claim 1, further comprising a circuit board positioned parallel to the support plate, the connector being a golden finger connector positioned on an edge of the circuit board.

5. The component module of claim 1, wherein the rotatable latch is rotated around a setting screw that is attached to the support plate.

6. The component module of claim 1, wherein the rotatable latch includes an engagement flange that has a semi-circular cutout to engage the locking nut.

7. The component module of claim 1, further comprising a protective cylinder attached to the support plate, the protective cylinder being positioned over the locking nut when the component module is secured to the motherboard.

8. The component module of claim 1, further comprising a top plate attached in perpendicular orientation to the support plate.

9. A computer device comprising:
a chassis including two side walls;
a motherboard mounted in the chassis between the side walls, the motherboard including a connector slot and a locking nut;
a top cover insertable over the chassis between the two side walls, the top cover including a pin extending downward from an interior surface of the top cover; and
a component module having:
a support plate;
a connector insertable in the connector slot of the motherboard; and
a rotatable latch mounted on the support plate, the rotatable latch having a locked position and a released position, the locked position engaging the locking nut to fix the component module to the motherboard, the released position disengaging the locking nut, wherein the pin of the top cover engages the rotatable latch to rotate the latch to the locked position when the top cover is inserted over the chassis.

10. The computer device of claim 9, wherein the component module includes a spring providing spring force to bias the rotatable latch to the released position.

11. The computer device of claim 9, wherein the component module includes one of a graphic processing unit (GPU), a central processing unit (CPU), a solid state storage device (SSD), or a network interface card (NIC).

12. The computer device of claim 9, wherein the component module includes a circuit board that is parallel to the support plate, the connector being a golden finger connector on an edge of the circuit board.

13. The computer device of claim 9, wherein the rotatable latch is rotated around a setting screw attached to the support plate.

14. The computer device of claim 9, wherein the rotatable latch includes an engagement flange that has a semi-circular cutout to engage the locking nut.

15. The computer device of claim 9, wherein the component module includes a protective cylinder attached to the support plate, the protective cylinder being positioned over the nut when the modular component is secured to the motherboard.

16. The computer device of claim 9, wherein the mother board includes another connector slot and another locking nut, the component module being insertable into the another connector slot.

17. The computer device of claim 16, wherein the top cover includes another pin in alignment with the another connector slot to engage the rotatable lever when the component module is inserted in the another connector slot.

\* \* \* \* \*